United States Patent [19]
Ichikawa

[11] Patent Number: 5,542,989
[45] Date of Patent: Aug. 6, 1996

[54] SOLAR BATTERY ROOFING FOR A SOLAR HOUSE

[75] Inventor: Yukimi Ichikawa, Kanagawa, Japan

[73] Assignee: Fuji Electric Co., Ltd., Kawasaki, Japan

[21] Appl. No.: 376,219

[22] Filed: Jan. 20, 1995

[30] Foreign Application Priority Data

Jan. 28, 1994 [JP] Japan ................................ 6-007973

[51] Int. Cl.⁶ .......................... E04D 13/18; H01L 31/05; H01L 31/048
[52] U.S. Cl. .......................... 136/251; 136/244; 136/291; 52/173.3
[58] Field of Search .................................. 136/244, 251, 136/291; 52/173.3

[56] References Cited

U.S. PATENT DOCUMENTS 4,860,509  8/1989  Laaly et al. ............................ 52/173.3

*Primary Examiner*—Aaron Weisstuch
*Attorney, Agent, or Firm*—Kanesaka & Takeuchi

[57] ABSTRACT

The roof of a solar house includes a plurality of crosspieces arranged parallel to each other, and a solar battery roofing for the solar house is fixed to the crosspieces. The solar battery is formed of a plurality of solar cells connected in series to form a solar cell row arranged parallel to the crosspieces. In case a plurality of solar cell rows is used, the solar cell rows are arranged parallel to each other, and the first and last solar cells in the rows are electrically connected to each other.

8 Claims, 2 Drawing Sheets

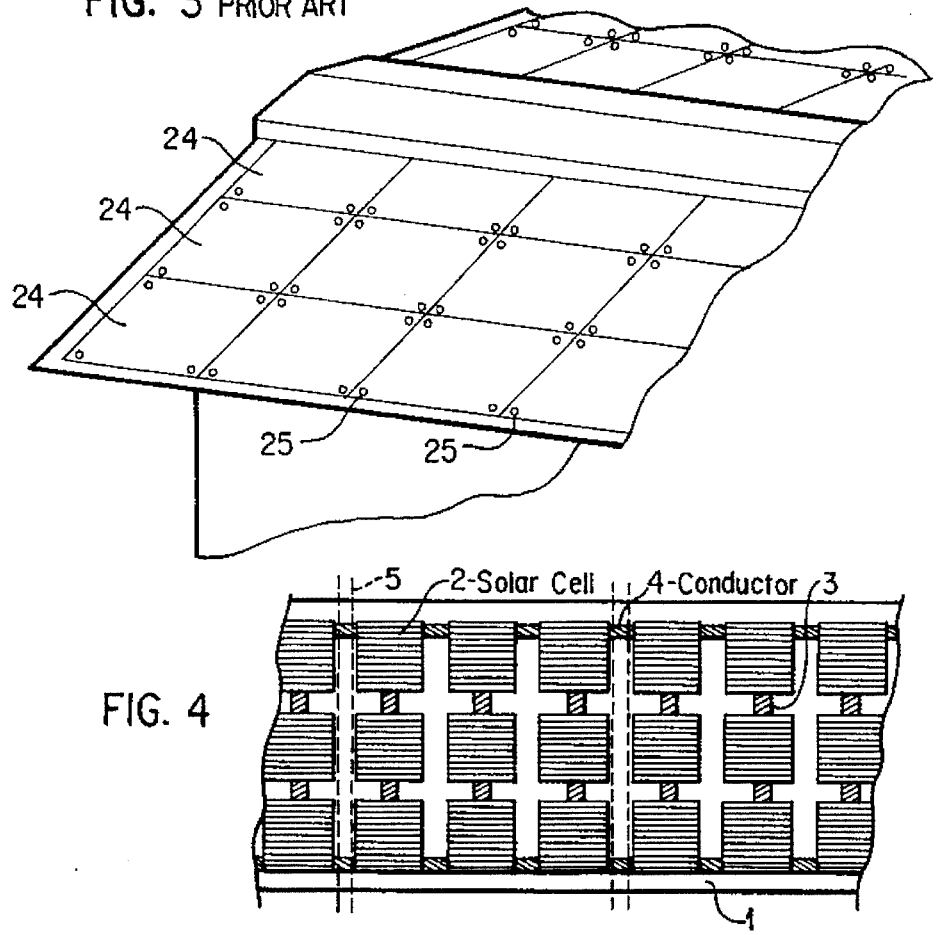
FIG. 3 PRIOR ART
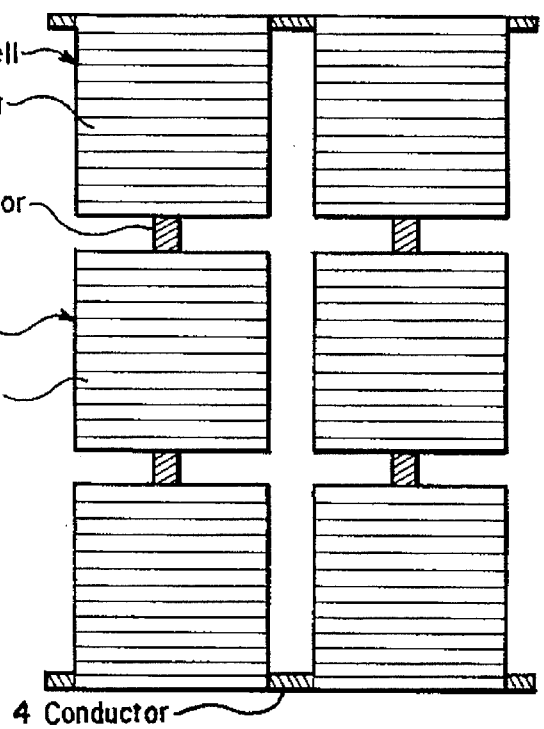
FIG. 4
FIG. 5

SOLAR BATTERY ROOFING FOR A SOLAR HOUSE

BACKGROUND OF THE INVENTION AND RELATED ART STATEMENT

The present invention relates to a solar house, and more specifically to a roofing for the solar house provided with a solar battery.

The use of solar batteries as a clean energy power supply source has been greatly anticipated. Since the output power of a solar battery is proportional to its surface area, a large installation area is required for obtaining a large electric power. An upper surface of a house, particularly a slant roof, which is not usually utilized for living but is close to a power consumption point, is suitable for installing the solar battery.

The simplest method to install the solar battery on the roof is to fix a mount to the roof members by fixtures and to put modules of the solar battery formed of multiple solar cells on the mount. The mount and the battery module form independent structures, which require structural strength and spoil the beauty of the house.

To solve the problem described above, it has been heretofore proposed to incorporate the solar cells into roof tiles, or to form the solar cells on an underlayer and covering the solar cells with a transparent encapsulating material.

FIGS. 2 and 3 are an example showing roofing elements in which the solar cells are placed on the underlayers. As shown in FIG. 2, the roofing elements 21, on the surface of which the solar cells are arranged, are placed on roof boards 22, and held in place with crosspieces 23 spaced apart from each other at a predetermined distance Reinforced-glass tiles are placed onto the roofing elements as finishing overlayers 24, which are further secured with fixing means 25 (FIG. 3).

In the roof shown in FIGS. 2 and 3, the crosspieces 23 shade the roofing elements 21 and thus reduce generation of the photovoltaic current by the shaded areas of the solar cells. When solar cells of nearly the same photovoltaic characteristics are connected in series, if the current generated by some of the solar cells is reduced, the total current is limited by the reduced current. As a result, the overall output is greatly reduced. The same problem also occurs by mounting the solar cells on the finishing overlayers, covering their surfaces with transparent weatherproof layers, and fixing them with the crosspieces.

The object of the present invention is to solve the problem described above and to provide a solar battery roofing for a solar house, wherein the reduction of the output of the solar cells due to shadowing by the crosspieces for fixing the roofing with the solar battery elements is minimized.

SUMMARY OF THE INVENTION

To achieve the object of the present invention, a solar house includes a solar battery roofing in a plate form and containing solar battery elements or cells, which are fixed onto the roof by crosspieces arranged in a specific direction so that the solar cells are connected to each other. In the invention, the solar cells connected in series are arranged parallel to the crosspieces. The rows of the solar cells connected in series may be connected parallel to each other in a direction perpendicular to the crosspieces.

In this case, the multiple solar cells are arranged in rows on the roofing, wherein the solar cells are connected in series in one direction on an elongated base plate, and are connected parallel in another direction perpendicular to the one direction. The roofing may be applied to the underlayer or the finishing overlayer.

Since the multiple solar cells of the roofing connected in series are arranged parallel to the crosspieces, the solar rays equally shade a particular row. Therefore, the overall output reduction rate is proportional to the shaded area relative to the total surface area of the solar cells, and can be controlled to a minimum. In case the roofing, which includes the multiple solar cells connected in series, uses a sheet or strip form base plate, the roofing may be fixed with the crosspieces parallel to the longitudinal direction thereof. The roofing installation work can be done easily.

BRIEF DESCRIPTION OF THE DRAWINGS

FIG. 3 shows a perspective view of the roof illustrated in FIG. 2 after construction;

FIG. 4 shows a plan view of a roofing of another embodiment of the present invention; and FIG. 5 shows a partially enlarged plan view of FIG. 4.

DETAILED DESCRIPTION OF PREFERRED EMBODIMENTS

Figure 1:
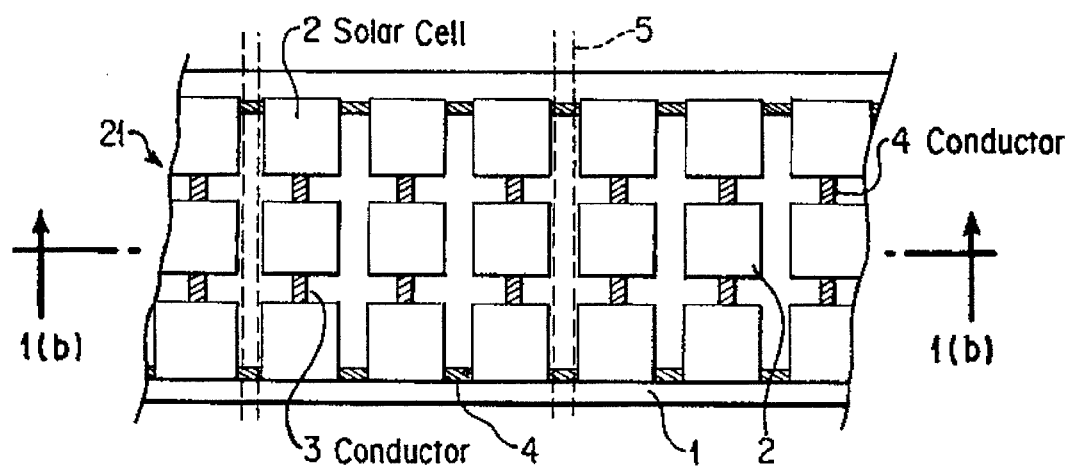
FIG. 1(a) is a plan view of a part of an embodiment of a roofing element according to the present invention.
FIG. 1(b) is a cross sectional view taken along line 1(b)—1(b) in FIG. 1(a)
Figure 1:
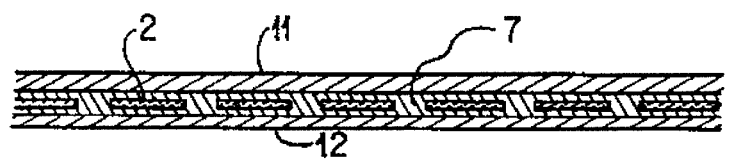

FIGS. 1(a) and 1(b) show one of the roofing elements 21 placed on the roof, in which a plurality of solar cells 2 are arranged in rows on an elongated base sheet 1. The solar cells 2 in the rows perpendicular to the longitudinal direction of the base sheet 1 are respectively connected in series by interconnectors 3, and the rows of the cells 2 parallel to each other are connected together at both ends thereof by interconnectors 4. The roofing 21 is used as illustrated in FIG. 2. As this roofing is an elongated sheet, which covers the roof in one piece in the direction of its ridge, it is not required to connect together. Further, the roofing 21 is fixed to the crosspiece 23 at the position as indicated by the dotted line 5 in FIG. 1(a). As shown in FIG. 3, the roofing is covered with a transparent finishing overlayer 24.

FIG. 1(b) shows a cross sectional view taken along line 1(b)—1(b) in FIG. 1(a). The solar cells 2 having photovoltage generating layers, such as thin amorphous-silicon films, and the interconnectors 3, 4, such as copper tapes, are sandwiched between two elongated sheets 11, 12 formed of high-molecular compound, such as polyester sulphone, aramid, polyethylene phthalate, or polyimide, and sealed with a bonding or sealing resin 7, such as ethylenevinylacetate (EVA). The elongated sheet 11 on the sunlight incident side is transparent. In order to improve the waterproofing ability of a high molecular weight film used in the sheet 11, a thin coating containing silicon dioxide may be applied.

Since the crosspiece 23 is arranged parallel to the direction of the series connection of the solar cells 2, the crosspiece 23 shades the solar rays for a particular row of the solar cells 2 connected in series. Since all the rows of the solar cells are connected parallel to each other, the current obtained from the rows not shaded is not affected by the current in the shaded cells. In case each row of the cells has nearly the same photovoltaic characteristics, even if voltage less than the working or open voltage of the operating rows of the cells is applied to both ends of the row of the shaded cells, the current flowing therethrough is negligibly small. Accordingly, it is not necessary to connect a reverse-current blocking diode to each row of the solar cells.

Figure 2:
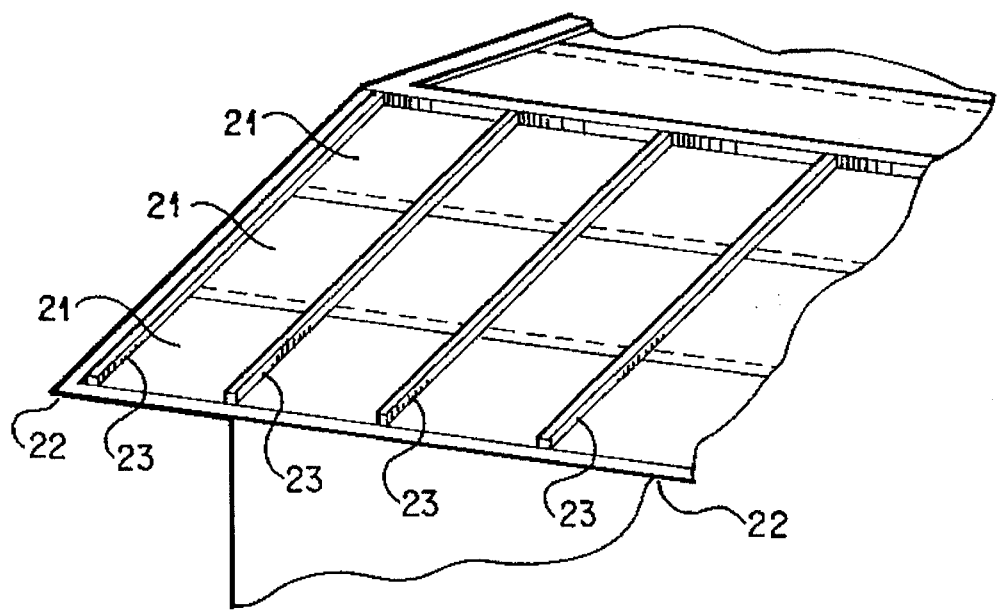
FIG. 2 shows a perspective view of a roof of a conventional solar house during construction.

In FIG. 1, three solar cells are connected in series, which is illustrative and not restrictive, and therefore two or more solar cells may be connected in series.

FIGS. 4 and 5 show another preferred embodiment of the present invention, wherein a plurality of cell units 2 is connected in series. One unit 2 is formed of eleven cell units 6 each in the shape of a strip and arranged side-by-side. The solar cells are arranged on the elongated base sheet 1 in the rows, and are connected with interconnectors 3, 4 in series and parallel, and can be used as the roofing for the house as illustrated in FIGS. 1 and 2. The cross sectional view of the roofing is as illustrated in FIG. 1(b), and the roofing is sealed with bonding resin to maintain weatherproofing ability.

In the embodiments described above, the crosspiece is arranged in the direction of the slant roof. However, in case the crosspiece is arranged parallel to the ridge of the roof, the connection of the rows of the solar cells 2 or the cell units 6 is made parallel to the ridge of the roof. It is also possible to build the solar cells into the roofing of a flat roof as well.

In the solar battery roofing according to the present invention, if the roofing with the solar cells is fixed by the crosspieces, the solar cells are connected in series in a row parallel to the crosspiece. As a result, the output decrease due to shadowing of the crosspiece is constant for a particular row. Thus, it is possible to limit the output decrease to the reduction of the shaded cell area. Therefore, it is possible to provide a solar house which utilizes the solar rays quite effectively.

What is claimed is:

1. A solar battery roofing for a solar house, comprising,
    a plurality of crosspieces arranged parallel to each other for fixing the solar battery roofing to the solar house, and
    a solar battery formed of a plurality of solar cells connected in electrical series to form a solar cell row, said solar cell row being arranged parallel to said crosspieces to substantially equally throughout the row receive shade by the crosspieces.

2. A solar battery roofing as claimed in claim 1, wherein said solar battery is formed of a plurality of electrically series connected solar cell rows arranged parallel to each other, said solar cell rows being electrically connected together in parallel.

3. A solar battery roofing as claimed in claim 2, further comprising a base sheet for supporting said solar cells in a plurality of rows and columns, each solar cell row having first and last cells electrically connected to respective first and last cells of an adjacent solar cell row.

4. A solar battery roofing as claimed in claim 3, wherein said solar cells are situated between upper and lower protective sheets and sealed by a sealing material.

5. A solar battery roofing as claimed in claim 3, wherein said solar battery roofing is an underlayer.

6. A solar battery roofing as claimed in claim 3, wherein said solar battery roofing is a finishing overlayer.

7. A solar battery roofing for a solar house, said roofing having a plurality of crosspieces arranged parallel to each other for fixing the solar battery roofing to the solar house, said roofing comprising:
    a solar battery formed of a plurality of solar cell rows arranged parallel to each other, each solar cell row having a plurality of solar cells connected in electrical series, said solar cell rows situated parallel to each other being electrically connected together in parallel and being arranged parallel to said crosspieces to substantially equally throughout the row receive shade by the crosspieces.

8. A solar battery roofing as claimed in claim 7, further comprising a base sheet for supporting said solar cells in a plurality of rows and columns, each solar cell row having first and last cells electrically connected to respective first and last cells of an adjacent solar cell row.

* * * * *